US008825182B2

(12) United States Patent
Simons et al.

(10) Patent No.: US 8,825,182 B2
(45) Date of Patent: Sep. 2, 2014

(54) POSITION CONTROL SYSTEM, LITHOGRAPHIC APPARATUS, AND METHOD TO CONTROL A POSITION OF A MOVABLE OBJECT

(75) Inventors: Wilhelmus Franciscus Johannes Simons, Beesel (NL); Norbertus Josephus Martinus Van Den Nieuwelaar, Tilburg (NL); Marcel François Heertjes, Best (NL); Joost Jozef Hendrik Gielis, Berchem (BE); Ferdinand Bernardus Johannus Wilhelmus Maria Hendriks, Wijchen (NL)

(73) Assignee: ASML Netherlands B.V., Veldhoven (NL)

( * ) Notice: Subject to any disclaimer, the term of this patent is extended or adjusted under 35 U.S.C. 154(b) by 599 days.

(21) Appl. No.: 13/169,749

(22) Filed: Jun. 27, 2011

(65) Prior Publication Data

US 2012/0019801 A1    Jan. 26, 2012

Related U.S. Application Data

(60) Provisional application No. 61/367,722, filed on Jul. 26, 2010.

(51) Int. Cl.
*G05B 11/01* (2006.01)
*G05B 19/18* (2006.01)
*G06F 19/00* (2011.01)
*G03F 7/20* (2006.01)

(52) U.S. Cl.
CPC .......... *G03F 7/7085* (2013.01); *G03F 7/70725* (2013.01); *G03F 7/70516* (2013.01); *G03F 7/70775* (2013.01); *G03F 7/70508* (2013.01); *G03F 7/70341* (2013.01)
USPC ................. 700/13; 700/45; 700/60; 700/114; 700/121; 716/54

(58) Field of Classification Search
None
See application file for complete search history.

(56) References Cited

U.S. PATENT DOCUMENTS

| 5,757,149 A | 5/1998 | Sato et al. |
| 7,265,813 B2 | 9/2007 | Houkes et al. |

(Continued)

FOREIGN PATENT DOCUMENTS

| CN | 1797212 | 7/2006 |
| CN | 101329516 | 12/2008 |

(Continued)

OTHER PUBLICATIONS

Japanese Office Action mailed Dec. 18, 2012 in corresponding Japanese Patent Application No. 2011-162948.

(Continued)

*Primary Examiner* — Sean Shechtman
(74) *Attorney, Agent, or Firm* — Pillsbury Winthrop Shaw Pittman LLP (57) ABSTRACT

A position control system to control the position of a movable object, including a position measurement system configured to determine an actual position related quantity of the movable object; a set-point generator to provide a position related set-point signal of the movable object; a comparator to provide an error signal on the basis of a comparison of the actual position related quantity and the position related set-point signal, a controller to provide a control signal on the basis of the error signal, a feed-forward device to provide a feed-forward signal on the basis of the position related set-point signal, and one or more actuators to act on the movable object on the basis of the control signal and the feed-forward signal, wherein the feed-forward device includes a disturbance force correction table including estimations of disturbance forces exerted on the movable object in dependence of a position of the movable object.

16 Claims, 3 Drawing Sheets

(56) References Cited

U.S. PATENT DOCUMENTS

| | | |
|---|---|---|
| 7,289,858 B2 | 10/2007 | Van Donkelaar et al. |
| 7,446,854 B2 | 11/2008 | Van Den Biggelaar |
| 7,630,059 B2 | 12/2009 | Butler et al. |
| 8,014,881 B2 | 9/2011 | Baggen et al. |
| 8,279,401 B2 | 10/2012 | Vervoordeldonk et al. |
| 2003/0016340 A1 | 1/2003 | Butler |
| 2005/0267609 A1 | 12/2005 | Van Donkelaar et al. |
| 2006/0139613 A1 | 6/2006 | Houkes et al. |
| 2006/0170382 A1 | 8/2006 | Yang et al. |
| 2006/0241873 A1 | 10/2006 | Hsin et al. |
| 2007/0182944 A1 | 8/2007 | Van De Biggelaar |
| 2008/0018877 A1 | 1/2008 | Butler et al. |
| 2008/0114473 A1 | 5/2008 | Heiland |
| 2008/0200998 A1 | 8/2008 | Baggen et al. |
| 2009/0222109 A1 | 9/2009 | Takagi |
| 2009/0268185 A1 | 10/2009 | Vervoordeldonk et al. |
| 2010/0149516 A1 | 6/2010 | Loopstra |
| 2010/0302526 A1 | 12/2010 | Saiki |

FOREIGN PATENT DOCUMENTS

| | | |
|---|---|---|
| CN | 101566854 | 10/2009 |
| JP | 8-241126 | 9/1996 |
| JP | 9-074059 | 3/1997 |
| JP | 9-149672 | 6/1997 |
| JP | 2004-164029 | 6/2004 |
| JP | 2005-354088 | 12/2005 |
| JP | 2006-191055 | 7/2006 |
| JP | 2007-088040 | 4/2007 |
| JP | 2007-214562 | 8/2007 |
| JP | 2008-028392 | 2/2008 |
| JP | 2008-166497 | 7/2008 |
| JP | 2008-199020 | 8/2008 |
| JP | 2009-088018 | 4/2009 |
| JP | 2010039003 A | 2/2010 |
| JP | 2010-074075 | 4/2010 |

OTHER PUBLICATIONS

Chinese Office Action dated Feb. 4, 2013 in corresponding Chinese Patent Application No. 201110200301.5.

POSITION CONTROL SYSTEM, LITHOGRAPHIC APPARATUS, AND METHOD TO CONTROL A POSITION OF A MOVABLE OBJECT

CROSS REFERENCE TO RELATED APPLICATIONS

This application claims priority and benefit under 35 U.S.C. §119(e) to U.S. Provisional Patent Application No. 61/367,722, entitled "Position Control System, Lithographic Apparatus, and Method To Control A Position Of A Movable Object", filed on Jul. 26, 2010. The content of that application is incorporated herein in its entirety by reference.

FIELD

The present invention relates to a position control system, a lithographic apparatus, and a method to control a position of movable object.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device; which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A conventional lithographic apparatus includes a position control system or controller to control the position of the substrate support and other movable objects of the lithographic apparatus. This position control system includes a position measurement system configured to measure a position of the substrate support.

Important factors for the performance of a lithographic apparatus are, for example, the throughput, i.e. the number of wafers that is produced within a certain period, and the overlay, i.e. the production quality. In industry, there is a continuous demand to improve the throughput and overlay of the lithographic apparatus.

In the conventional lithographic apparatus, the substrate stage accuracy, which is measured in 6 degrees of freedom and is important for overlay, is controlled. Generally the two requirements of a higher throughput and a better overlay performance contradict each other, as higher accelerations used for higher throughput cause larger internal dynamic vibrations (or deformations) of the stages, which result in a deterioration of the substrate stage positioning accuracy.

Furthermore, disturbance forces may be exerted on the substrate stage during the lithographic process. These disturbance forces may also have a negative effect on positioning accuracy and/or settling time.

In view thereof, there is need for a position control system which is capable of controlling a stage with sufficient high speed and position accuracy.

SUMMARY

It is desirable to provide a position control system for a movable object of a lithographic apparatus which may increase the accuracy and/or speed of position control of the movable object. Also, it is desirable to provide a method to control a position of a movable object of a lithographic apparatus which may increase the accuracy and/or speed of position control of the movable object.

According to an embodiment of the invention, there is provided a position control system to control a position related quantity of a movable object, comprising: a position measurement system configured to determine an actual position related quantity of the movable object; a set-point generator to provide a position related set-point signal of the movable object; a comparator to provide an error signal on the basis of a comparison of the actual position related quantity and the position related set-point signal; a controller to provide a control signal on the basis of the error signal; a feed-forward device to provide a feed-forward signal on the basis of the position related set-point signal, and an actuator to act on the movable object on the basis of the control signal and the feed-forward signal, wherein the feed-forward device includes a disturbance force correction table including estimations of disturbance forces exerted on the movable object in dependence of a position of the movable object.

According to an embodiment of the invention, there is provided a lithographic apparatus comprising: an illumination system configured to condition a radiation beam; a patterning device support configured to support a patterning device being capable of imparting the radiation beam with a pattern in its cross-section to form a patterned radiation beam; a substrate support constructed to hold a substrate; and a projection system configured to project the patterned radiation beam onto a target portion of the substrate, wherein the lithographic apparatus includes a position control system to control a position related quantity of a movable object of the lithographic apparatus, comprising: a position measurement system configured to determine an actual position related quantity of the movable object; a set-point generator to provide a position related set-point signal of the movable object; a comparator to provide an error signal on the basis of a comparison of the actual position related quantity and the position related set-point signal; a controller to provide a control signal on the basis of the error signal; a feed-forward device to provide a feed-forward signal on the basis of the position related set-point signal, and an actuator to act on the movable object on the basis of the control signal and the feed-forward signal, wherein the feed-forward device includes a disturbance force correction table including estimations of disturbance forces exerted on the movable object in dependence of a position of the movable object.

According to an embodiment of the invention, there is provided a method for controlling a position related quantity of a movable object, comprising: determining with a position measurement system a position related quantity of the movable object; comparing with a comparator a measured position related quantity and a position related set-point signal provided by a set-point generator to obtain an error signal;

providing a control signal by a controller on the basis of the error signal, and providing a feed-forward signal by a feed-forward device on the basis of the position related set-point signal, and actuating an actuator on the basis of the control signal and the feed-forward signal, wherein providing the feed-forward signal includes using a disturbance force correction table including estimations of disturbance forces exerted on the movable object in dependence of a position of the movable object.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
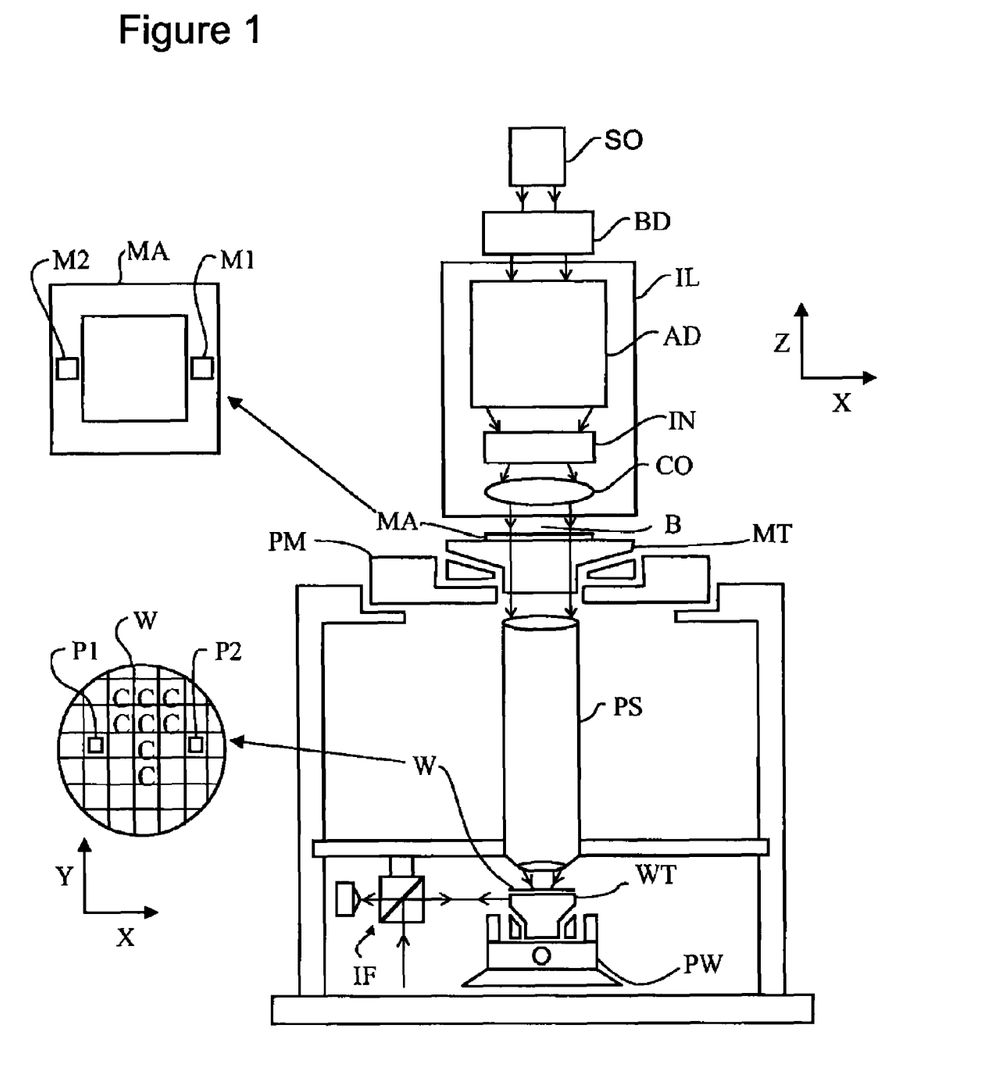
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source so and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
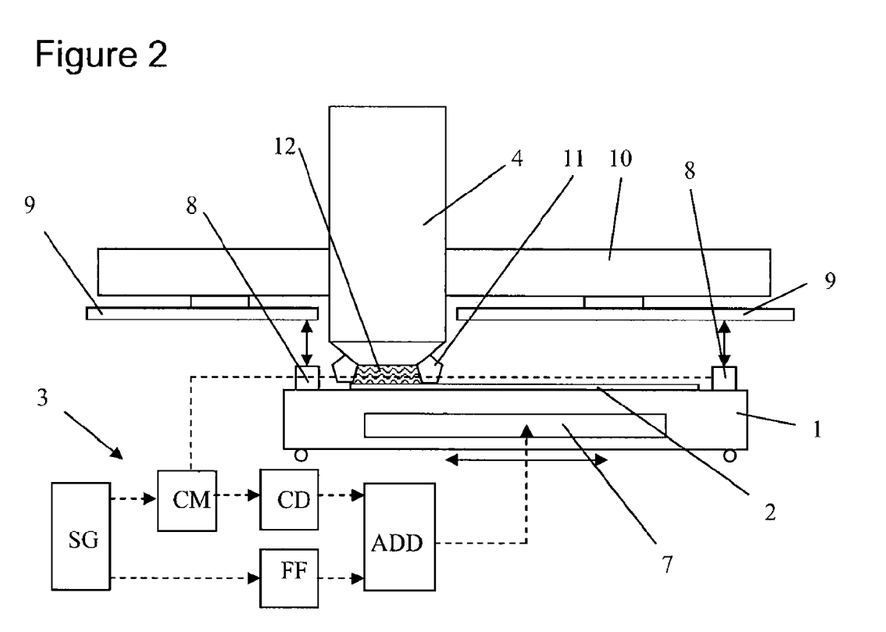
FIG. 2 depicts a detail of a lithographic apparatus according to an embodiment of the invention

FIG. 2 shows a detail of a lithographic apparatus with a substrate support 1 supporting a substrate 2 according to an embodiment of the invention. A position control system 3 is provided to control the position of the substrate support 2 in order to subsequently position the different target portions C of the substrate 2 with respect to the projection system 4. In this embodiment, the substrate support 1 is movable in a number of degrees of freedom, typically three coplanar degrees of freedom (in a plane parallel to the substrate) or in all six degrees of freedom.

The position control system 3 includes a position measurement system 8, 9 configured to measure the position of the substrate support in a suitable number of degrees of freedom, a controller CD configured to provide control signals at least on the basis of the position measured by the position measurement system, and one or more actuators 7 configured to actuate the substrate support 1 in a desired direction.

The actuator 7 may be any actuator which is capable of moving the substrate support 1 in a desired direction. The actuators 7 may be configured to actuate the substrate support 1 in one or more degrees of freedom. Two or more actuators may be provided for actuation in different degrees of freedom or for actuation at different locations on the substrate support 1. Such actuators and actuator arrangements are known in the art.

The position measurement system 8, 9 is provided to measure the position of the substrate support 1, and may be any position measurement system suitable to measure the position of the substrate support with high accuracy (nanometer accuracy) may be applied, for instance an interferometer system or an encoder-type measurement system. In FIG. 2 an encoder-type measurement system is shown including a number of encoder-type sensors 8, mounted on the substrate support 1 and a number of grid plates 9 mounted on a substantially stationary frame 10, also referred to as metro-frame. In an alternative embodiment the sensors 8 may be mounted on the metro-frame 10 while one or more grid plates 9 are mounted on the substrate support 1.

The position control system 3 includes a comparator CM wherein the actual position of the substrate support 2 is subtracted from a desired or set-point position which is for instance given by a set-point generator SG. The resulting signal which is often referred to as servo error is fed into controller CD which provides on the basis of the input of the controller unit a control signal. The controller CD may include a PID controller including a proportional, a derivative and an integral controller part.

The lithographic apparatus of FIG. 2 is an immersion-type lithographic apparatus as described above. In this lithographic apparatus an immersion hood 11 is provided to hold a quantity of immersion liquid 12 between the projection system 4 and one or both of the substrate support 1 and the substrate 2. The provision of the immersion liquid 12 between the projection system 4 and the substrate 2 may have a beneficial effect on the lithographic process, for instance for increasing the numerical aperture of the projection system.

However, the presence of the immersion liquid 12 may be the source of disturbance forces exerted on the substrate support 2. These disturbance forces may in particular occur when the immersion hood 12 passes an edge of the substrate 2. Also, other disturbance forces may be exerted on the substrate support 1. These disturbance forces may deteriorate the position accuracy and/or positioning speed of the position control system 3.

In accordance with one embodiment of the present invention, the position control system 3 includes a feed-forward device FF configured to provide a feed-forward signal on the basis of the set-point position. The feed-forward device FF includes a disturbance force correction table DFCT including estimations of disturbance forces exerted on the movable object in dependence of a position of the substrate support 1. A considerable part of the disturbance forces are reproducible, i.e. substantially the same disturbance forces occur when the same path is followed with the same parameter settings. By estimation of the reproducible disturbance forces and adding these disturbance forces in the disturbance force correction table DFCT of the feed-forward device, the disturbance forces can be compensated. As a result, the error signal is decreased and thus the positioning accuracy is increased.

In the position control system 3, a set-point signal is fed into the feed-forward unit FF with the disturbance force correction table DFCT. The feed-forward device provides a feed-forward signal on the basis of the set point position or a derivative thereof. The control signal and the feed-forward signal are added in an addition device ADD, whereby the direction of the feed-forward signal is in opposite direction to the actual disturbance forces. The sum of the control signal and feed-forward signal is fed to the one or more actuators 7 to actuate the substrate support 1 to the desired position, i.e. the set-point position.

Figure 3:
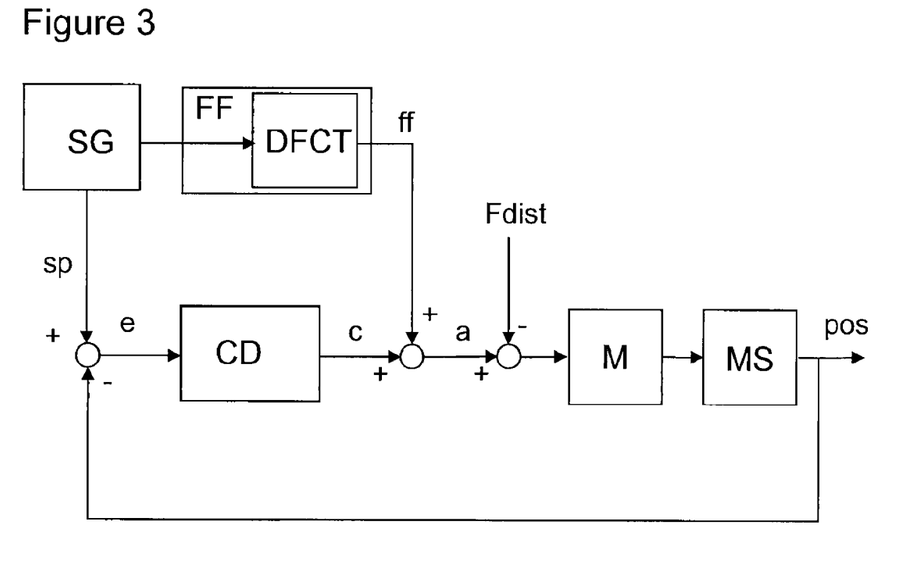
FIG. 3 depicts a control scheme of a position control system according to an embodiment of the invention.

FIG. 3 shows a control scheme including the feed-forward device FF of the invention. A set point generator SG provides a set-point signal sp which is compared with an actual position pos of the substrate support 2 obtained by a position measurement system MS. The resulting error signal e is fed to a controller CD to provide a control signal c. A set-point signal is also fed to the feed-forward device FF. The feed-forward device FF includes the disturbance force correction table DFCT. The feed-forward device provides a feed-forward signal ff. The feed-forward signal ff and the control signal c are added to form an actuator signal a, which is fed to the process mechanics M, via the one or more actuators 7.

It will be appreciated that the direction of signals and forces resulting from the feed-forward device FF should be opposite to the direction of the actual disturbance forces exerted on the substrate support 1. Therefore, the addition of the control signal c and the feed-forward signal ff may also be subtraction of the feed-forward signal ff from the control signal c. The disturbance force correction table DFCT may include information on disturbance forces in one degree of freedom, for instance in the vertical or z-direction, or in multiple degrees of freedom, such as three coplanar or six degrees of freedom.

The estimations of disturbance forces may for instance be obtained by moving the substrate support 1 without using the feed-forward device FF, measuring the error signal e obtained by the comparator CM, and calculating disturbance forces required to compensate the error signal e. As an alternative, the estimations of disturbance forces may be obtained by gathering general calibration data during set-up, and deriving disturbance forces on the basis of the general calibration data. The data values of the disturbance force correction table DFCT may for instance be obtained by determining the average of multiple calibrations.

Any other method to obtain estimations of the disturbance forces may also be used. For example, the disturbance forces may be estimated on the basis of a dynamic model of the substrate support 1.

Further, during use of the feed-forward device FF to compensate for disturbance forces, the error signal can be monitored. This error signal may be used to update the data of the disturbance force correction table DFCT. In other words, the control system may be arranged to provide the error signal to the disturbance forces correction table for updating the estimations of disturbance forces. This way, during use of the position control system, the estimation may be adapted such that the error signal is minimized. This may help to correct for changes of the object that is controlled by the position control system. For example, the substrate support 1 may heat up during movement. This may cause the sensors 8 to measure a position that drifts over time. This may lead to an increasingly larger error signal. By updating the estimations in the disturbance force correction table DFCT, the drift can be compensated for.

The disturbance forces exerted on the substrate support 1 are not only dependent on the position of the substrate support, but also on other parameters such as speed of the substrate support 1, direction of movement etc. A disturbance force correction table DFCT for all possible combinations of positions and other parameter settings may require a very large number of calibration steps, and may result in a very large table with all these parameter settings.

In one embodiment, the disturbance force correction table DFCT may include estimations of disturbance forces for a limited number of routes of the substrate support 1. For instance, routes which are often followed by the substrate support 1 may be used as basis for the disturbance force correction table DFCT. A substrate support 1 of a lithographic apparatus often follows the same scanning route during the lithographic process.

Figure 4:
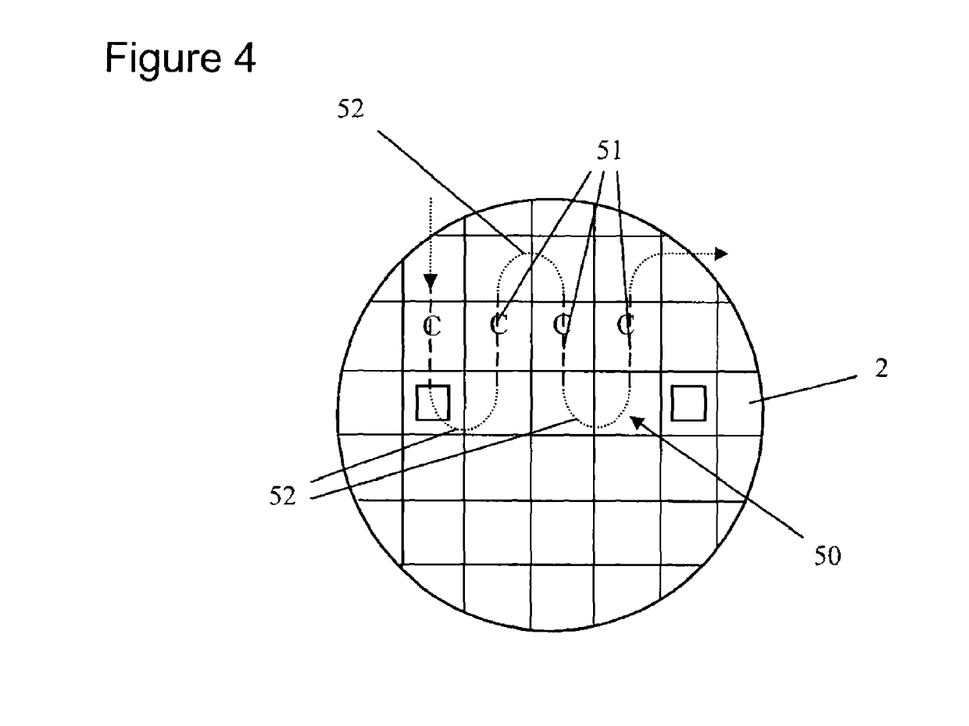
FIG. 4 depicts schematically a cross section of a part of an immersion-type lithographic apparatus according to an embodiment of the invention.

FIG. 4 shows a top view of a substrate 2 having a number of target portions C. In practice many more target portions C may be present on the substrate 2. With a combination of dotted and dashed lines a scanning route 50 of a movement of the projection system 4 with respect to the substrate 2 during the lithographic process is shown. In this scanning route 50 a first target portion C is scanned during a constant movement. Thereafter, the scanning direction is changed and a further adjacent target portion C is scanned. Then, again the scanning direction is changed and a target portions C is scanned. This scanning route 50 is only an example of a possible route to be followed during the scanning process. In practice many alternative routes are known. However, for a lithographic process often the same routes are followed.

The scanning route 50 includes multiple scanning movements 51 wherein a target portion C is scanned with a constant movement, and multiple transferring movements 52 between two subsequent scanning movements. The scanning movement 51 usually starts before and ends after the actual target portion C.

In an embodiment, the disturbance force correction table DFCT includes estimations of disturbance forces for a limited number of routes, or parts of a route. In such embodiment, the estimations of disturbance forces may be obtained by moving the substrate support 1 along the limited number of routes without using the feed-forward device FF, measuring the error signal e obtained by the comparator CM, and calculating disturbance forces required to compensate the error signal e. As an alternative, the estimations of disturbance forces may be obtained by gathering general calibration data during set-up, and deriving disturbance forces for the limited number of routes on the basis of the general calibration data. Any other method, for example a method based on a dynamic model of the substrate support behavior may also be used.

The disturbance force correction table DFCT may include estimations of disturbance forces for a number of positions in at least one known route of the substrate support 1. In one embodiment, each estimation of a disturbance force in one of the positions is based on nominal parameter settings. These nominal parameter settings are the parameter settings which are normally used during the scanning route such as a nominal speed. The nominal speed and other nominal parameter settings may be different for different positions of the substrate support 1.

It may be possible that during the actual scanning route, the actual speed or other parameter settings may be different than the nominal speed or nominal parameter settings. The feed-forward device FF includes a parameter correction device PCD to correct the values of the disturbance force correction table for the difference between the nominal parameter settings and actual parameters in the respective position of the substrate support 1. In such parameter correction device PCD, the estimated disturbance force for a nominal speed of the disturbance force correction table DFCT, may, for example, be decreased when actual speed is lower than the nominal speed.

As explained above, the scanning route 50 includes multiple scanning movements 51 and transferring movements 52. During the scanning movements 51, wherein the image is actually projected on the substrate 2, it is desirable that the positioning of the substrate support 1 be accurate. During the transferring movements 52 the accuracy is of less importance since no image is projected during these movements. In view of this difference between the scanning movements 51 and the transferring movements 52, in an embodiment, the compensation of the disturbance forces using the disturbance force correction table DFCT may only be used during the scanning movements 51. In this way, it may be avoided that the compensation of the feed-forward device FF in the transferring movement 52 results in a decrease of accuracy during the subsequent scanning movement 51. Also, less data is required in the disturbance force correction table DFCT resulting in a less complex system.

As an alternative, the feed-forward device FF may include a transferring movement compensation device TMCD to gradually change, during the transferring movement 52, an output signal of the feed-forward device FF from a value relating to a last position of a previous scanning movement 51 to a value relating to a first position of a next scanning movement 51. By providing such a transferring movement compensation device TMCD a smooth transition of a scanning movement 51 to a next scanning movement may be obtained.

In a general application of the position control system according to one embodiment of the invention a transferring movement compensation device TMCD may be provided to gradually change an output signal of the feed-forward device from a value relating to a position known in the disturbance force correction table to a value relating to a next position known in the disturbance force correction table. Such transferring movement compensation device TMCD may beneficially be used when not for all positions of the movable object data is present in the disturbance force correction table DFCT, for instance for positions where positioning accuracy is of less importance.

Figure 5:
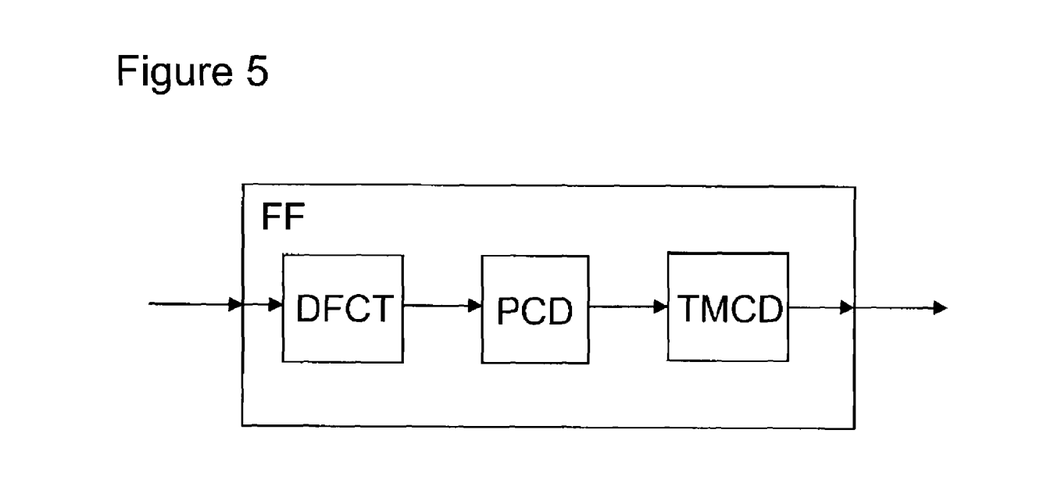
FIG. 5 depicts an alternative embodiment of a feed-forward device according to an embodiment of the invention.

FIG. 5 shows an embodiment of a feed-forward device including the disturbance force correction table DFCT, the parameter correction device PCD, and transferring movement compensation device TMCD.

Hereinabove a position control system for position control of a substrate support has been described. Similar position control systems may also be used to control the position of other movable objects of the lithographic apparatus.

The above position control system has been described with respect to one degree of freedom. In practice, the position control system will be configured to control the position of the substrate support in a number of degrees of freedom, typically 3 co-planar degrees of freedom or six degrees of freedom. For this reason, the position control system 3 may include an arrangement of one or multidimensional sensors configured to measure the position of the substrate support in the desired number of degrees of freedom, as well as an arrangement of one or multi-dimensional actuators to make positioning of the substrate support in all desired degrees of freedom possible.

Furthermore, the position control system 3 as described above is directed at a control system to control the position of the substrate support. Similar systems may be provided to control any other relevant position related quantity of the substrate support with respect to a position related set-point signal, such as the speed or acceleration, or to control a position related quantity of another movable object of the lithographic apparatus.

Hereinabove embodiments of controllers have been described. It will be appreciated that these controllers can be separate controller units, but also may be integrated as software on a processing unit, for instance a dedicated control processing unit or as a part of the central processing unit of the lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A position control system to control a position related quantity of a movable object, the position control system comprising:
    a position measurement system configured to determine an actual position related quantity of the movable object;
    a set-point generator configured to provide a position related set-point signal of the movable object;
    a comparator configured to provide an error signal on the basis of a comparison of the actual position related quantity and the position related set-point signal;
    a controller configured to provide a control signal on the basis of the error signal;
    a feed-forward device configured to provide a feed-forward signal on the basis of the position related set-point signal, said feed-forward signal to be combined with said control signal using an addition device; and
    an actuator configured to act on the movable object on the basis of the control signal and the feed-forward signal,
    wherein the feed-forward device comprises a disturbance force correction table comprising estimations of disturbance forces exerted on the movable object in dependence of a position of the movable object, said feed-forward device providing said feed-forward signal using said disturbance force correction table.

2. The control system of claim 1, wherein the control system is arranged to provide the error signal to the disturbance forces correction table for updating the estimations of disturbance forces.

3. The control system of claim 1, wherein the disturbance force correction table comprises estimations of disturbance forces of a route of the movable object.

4. The control system of claim 3, wherein the disturbance force correction table comprises estimations of disturbance forces for a number of positions in the route, wherein each estimation of a disturbance force in one of the positions is based on nominal parameter settings.

5. The control system of claim 4, wherein the feed-forward device comprises a parameter correction device configured to correct the values of the disturbance force correction table for a difference between the nominal parameter settings of and actual parameters in the one of the positions of the route.

6. The control system of claim 3, wherein the movable object is a substrate support of a lithographic apparatus, and wherein the route is a scanning route of the substrate support.

7. The control system of claim 6, wherein the scanning route comprises multiple scanning movements and at least one transferring movement to be made between two subsequent scanning movements, wherein the disturbance force correction table mainly comprises estimations of disturbance forces in the scanning movements.

8. The control system of claim 1, wherein the feed-forward device comprises a transferring movement compensation device configured to gradually change an output signal of the feed-forward device from a value relating to a last position of a previous scanning movement to a value relating to a first position of a next scanning movement during the transferring movement.

9. The control system of claim 1, wherein the feed-forward device comprises a transferring movement compensation device configured to gradually change an output signal of the feed-forward device from a value relating to a position known in the disturbance force correction table to a value relating to a next position known in the disturbance force correction table.

10. A lithographic apparatus comprising:
    an illumination system configured to condition a radiation beam;
    a patterning device support configured to support a patterning device being capable of imparting the radiation beam with a pattern in its cross-section to form a patterned radiation beam;
    a substrate support constructed to hold a substrate;
    a projection system configured to project the patterned radiation beam onto a target portion of the substrate; and
    a position control system configured to control a position related quantity of a movable object of the lithographic apparatus, the position control system comprising
        a position measurement system configured to determine an actual position related quantity of the movable object,
        a set-point generator configured to provide a position related set-point signal of the movable object;
        a comparator configured to provide an error signal on the basis of a comparison of the actual position related quantity and the position related set-point signal,
        a controller configured to provide a control signal on the basis of the error signal,
        a feed-forward device configured to provide a feed-forward signal on the basis of the position related set-point signal, said feed-forward signal to be combined with said control signal using an addition device, and
        one or more actuators to act on the movable object on the basis of the control signal and the feed-forward signal,
    wherein the feed-forward device comprises a disturbance force correction table comprising estimations of disturbance forces exerted on the movable object in dependence of a position of the movable object, said feed-forward device providing said feed-forward signal using said disturbance force correction table.

11. A method of controlling a position of a movable object, the method comprising:
- determining with a position measurement system a position related quantity of the movable object;
- comparing with a comparator a measured position related quantity and a position related set-point signal provided by a set-point generator to obtain an error signal;
- providing a control signal by a controller on the basis of the error signal;
- providing a feed-forward signal by a feed-forward device on the basis of the position related set-point signal;
- combining said feed-forward signal and said control signal using an additional device, and
- actuating an actuator on the basis of the control signal and the feed-forward signal,
- wherein providing the feed-forward signal comprises using a disturbance force correction table comprising estimations of disturbance forces exerted on the movable object in dependence of a position of the movable object, said feed-forward device providing said feed-forward signal using said disturbance force correction table.

12. The method of claim 11, wherein the disturbance force correction table comprises estimations of disturbance forces of a route of the movable object.

13. The method of claim 12, wherein the method comprises obtaining estimations of disturbance forces by moving the movable object along the at least one route without using the feed-forward device, measuring the error signal obtained by the comparator, and calculating disturbance forces required to compensate the error signal.

14. The method of claim 13, wherein the method comprises obtaining estimations of disturbance forces comprises gathering general calibration data during set-up, and deriving disturbance forces for the at least one route on the basis of the general calibration data.

15. The method of claim 14, wherein the movable object is a substrate support of a lithographic apparatus, and wherein the route is a scanning route of the substrate support.

16. The method of claim 15, wherein the disturbance force correction table comprises estimations of disturbance forces resulting from an immersion hood of a lithographic apparatus passing an edge of a substrate in the lithographic apparatus.

* * * * *